(12) United States Patent
Nakamura

(10) Patent No.: US 6,381,565 B1
(45) Date of Patent: Apr. 30, 2002

(54) FUNCTIONAL LOGIC CIRCUIT VERIFICATION DEVICE

(75) Inventor: Yuichi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/377,844

(22) Filed: Aug. 20, 1999

(30) Foreign Application Priority Data

Aug. 21, 1998 (JP) .......................................... 10-235167

(51) Int. Cl.[7] .............................................. G06K 19/00
(52) U.S. Cl. .............................................. 703/28; 716/5
(58) Field of Search ................ 716/5; 703/28

(56) References Cited

U.S. PATENT DOCUMENTS

| 4,807,161 A | * | 2/1989 | Comfort ..................... 702/121 |
| 5,339,262 A | * | 8/1994 | Rostoker ...................... 716/4 |
| 5,629,876 A | * | 5/1997 | Huang ....................... 703/120 |
| 5,640,337 A | * | 6/1997 | Huang ......................... 703/23 |
| 5,940,603 A | * | 8/1999 | Huang ........................... 716/5 |
| 6,058,492 A | * | 5/2000 | Sample ......................... 714/33 |

FOREIGN PATENT DOCUMENTS

| JP | 2-245831 | | 10/1990 |
| JP | 02000132420 A | * | 5/2000 |

* cited by examiner

Primary Examiner—John F. Niebling
Assistant Examiner—Stacey Whitmore
(74) Attorney, Agent, or Firm—Sughrue Mion, PLLC

(57) ABSTRACT

A device for verifying the operation of a functional logic circuit such as a VLSI implements a circuit fictionally equivalent to the functional circuit, and supplies electric signals thereto. The device includes an equivalent logic circuit, a functional equivalent board and an input/output section. The equivalent logic circuit, mounted on an LSI socket board, is composed of programmable logic elements that implement logic specifications of a first part of the verified functional logic circuit to the level of the gate circuit diagram of the first part. The functional equivalent board implements a circuit functionally equivalent to the other part of the functional circuit in point of input and output. The functional equivalent board implements memory and arithmetic operation circuits.

18 Claims, 6 Drawing Sheets

FUNCTIONAL LOGIC CIRCUIT VERIFICATION DEVICE

BACKGROUND OF THE INVENTION

The present invention relates to a functional logic circuit verification device for verifying whether or not a functional logic circuit such as a VLSI can operate correctly, and in particular, to a functional logic circuit verification device for executing verification of a functional logic circuit that includes components which are difficult to be implemented and emulated by programmable logic elements such as FPGAs (Field Programmable Gate Arrays).

DESCRIPTION OF PRIOR ART

A variety of devices and methods have been employed for verifying functions of functional logic circuits (integrated circuits, systems, etc.). In such verification techniques, a circuit which is equivalent to the functional logic circuit is formed using electrically programmable logic elements, and the verification of the functional logic circuit is executed using the equivalent circuit. For example, a device which emulates electric hardware systems has been disclosed in Japanese Patent Application Laid-Open No.HEI2-245831. In the conventional technique, verification of a functional logic circuit is executed by preparing a circuit that is equivalent to the verified functional logic circuit by substituting each element of the verified functional logic circuit with a rewritable logic element and actually supplying electric signals to the equivalent circuit.

However, in such verification techniques, all the parts of the verified functional logic circuit including memory devices, arithmetic operation circuits, etc. are substituted with programmable logic elements such as FPGAs (Field Programmable Gate Arrays) in order to realize a totally logically equivalent circuit, even though the programmable logic elements such as FPGAs are not suitable or efficient for implementing the memory devices, arithmetic operation circuits, etc. The number of FPGAs which are necessary for implementing a memory device or an arithmetic operation circuit is very large, therefore, in such verification using FPGAs only, circuit scale of the equivalent circuit including a considerable number of FPGAs is necessitated to be very large, and thus the verification of the functional logic circuit can not be executed efficiently.

Further, a logically completed special-purpose input/output device is needed to be prepared specially in order to provide input/output to the equivalent circuit of the verified functional logic circuit, and thus data input/output to/from the equivalent circuit is impossible without implementing and manufacturing such a logically completed special-purpose input/output device.

SUMMARY OF THE INVENTION

It is therefore the primary object of the present invention to provide a functional logic circuit verification device, by which high-capacity memory, multiple-port memory, arithmetic operation circuits, etc., which are difficult to be emulated or implemented by programmable logic elements such as FPGAs, can be emulated and implemented by a functionally equivalent circuit that includes devices other than FPGAs, and thereby efficiency of the verification can be improved.

Another object of the present invention is to provide a functional logic circuit verification device, by which verification of functional logic circuits can easily be executed without the preparation of the special-purpose input/output device for the equivalent circuit.

Another object of the present invention is to provide a functional logic circuit verification device, in which the main part of the functional logic circuit verification device can be designed as a combination of FPGAs only on a circuit board, and thereby the design of the functional logic circuit verification device can be simplified.

In accordance with a first aspect of the present invention, there is provided a functional logic circuit verification device for verifying the operation of a functional logic circuit such as a VLSI, by which a circuit that is functionally equivalent to the verified functional logic circuit is implemented and the verification of the functional logic circuit is executed by actually supplying electric signals thereto. The functional logic circuit verification device comprises an equivalent logic circuit, a functional equivalent board, one or more functional equivalent board connectors, an input/output section and one or more input/output section connectors. The equivalent logic circuit, which is mounted on a circuit board, is composed of programmable logic elements so as to implement logic specifications of part of the verified functional logic circuit to the level of the gate circuit diagram of the part of the verified functional logic circuit. The functional equivalent board implements a circuit that is functionally equivalent to the other part of the verified functional logic circuit in point of input and output. The one or more functional equivalent board connectors connect the functional equivalent board to the circuit board on which the equivalent logic circuit is mounted. The input/output section implements input and output of the functional logic circuit verification device. And the one or more input/output section connectors connect the input/output section to the circuit board on which the equivalent logic circuit is mounted.

In accordance with a second aspect of the present invention, in the first aspect, the circuit board on which the equivalent logic circuit is mounted is an LSI socket board having a plurality of sockets for LSIs.

In accordance with a third aspect of the present invention, in the second aspect, the functional equivalent board connectors and/or the input/output section connectors are LSI pin-compatible connectors each of which has the same pin configuration as LSIs which are employed as the programmable logic elements of the equivalent logic circuit.

In accordance with a fourth aspect of the present invention, in the third aspect, the LSI pin-compatible connector is provided with buffers for ensuring driving abilities in connections.

In accordance with a fifth aspect of the present invention, in the first aspect, the programmable logic elements of which the equivalent logic circuit is composed are FPGAs (Field Programmable Gate Arrays).

In accordance with a sixth aspect of the present invention, in the fifth aspect, the functional equivalent board connectors and/or the input/output section connectors are FPGA pin-compatible connectors each of which has the same pin configuration as the FPGAs which are employed as the programmable logic elements of the equivalent logic circuit.

In accordance with a seventh aspect of the present invention, in the first aspect, the functional equivalent board includes data lines, address lines, control lines, a control logic circuit, connection switches, and flip-flops each of which having fan-out lines, and thereby implements a circuit that is functionally equivalent to a multiple-port memory in point of input and output.

In accordance with an eighth aspect of the present invention, in the seventh aspect, the functional equivalent board has an input/output interface that is equivalent to the input/output interface of the multiple-port memory which is emulated by the functional equivalent board.

In accordance with a ninth aspect of the present invention, in the first aspect, the functional equivalent board includes data lines, control lines, a general-purpose LSI, software for letting the general-purpose LSI execute a desired process, and a control logic circuit, and thereby implements a circuit that is functionally equivalent to an arithmetic operation circuit in point of input and output.

In accordance with a tenth aspect of the present invention, in the ninth aspect, the functional equivalent board has an input/output interface that is equivalent to the input/output interface of the arithmetic operation circuit which is emulated by the functional equivalent board.

In accordance with an eleventh aspect of the present invention, in the ninth aspect, the functional equivalent board further includes an operation program library means and an operation program generation means. Programs for predetermined operations such as addition, multiplication, division, etc. are preliminarily stored in the operation program library means. The operation program generation means generates a sequence of an operation program to be executed by the general-purpose LSI, based on arithmetic operation instructions which are supplied from the equivalent logic circuit via the control lines and using the programs extracted from the operation program library means.

In accordance with a twelfth aspect of the present invention, in the first aspect, the input/output section includes a computer, an interface of the computer to the circuit board on which the equivalent logic circuit is mounted, and control software which is executed by the computer for controlling the interface.

In accordance with a thirteenth aspect of the present invention, in the twelfth aspect, the control software of the input/output section prepares an instruction input/output interface and a data input/output interface in the interface of the computer according to a verification program/data, separates the verification program/data into instructions and data, sends the separated instructions to the instruction input/output interface so as to be inputted to the circuit board on which the equivalent logic circuit is mounted, and sends the separated data to the data input/output interface so as to be inputted to the circuit board.

In accordance with a fourteenth aspect of the present invention, in the thirteenth aspect, the control software of the input/output section adds special instructions for the functional equivalent board to the separated instructions, and sends the separated instructions including the special instructions to the instruction input/output interface so as to be inputted to the circuit board.

In accordance with a fifteenth aspect of the present invention, in the twelfth aspect, the interface of the input/output section includes a monitoring means for monitoring the input/output of data and instructions to/from the circuit board so that congestion will not occur in the input/output to/from the circuit board.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Figure 1:
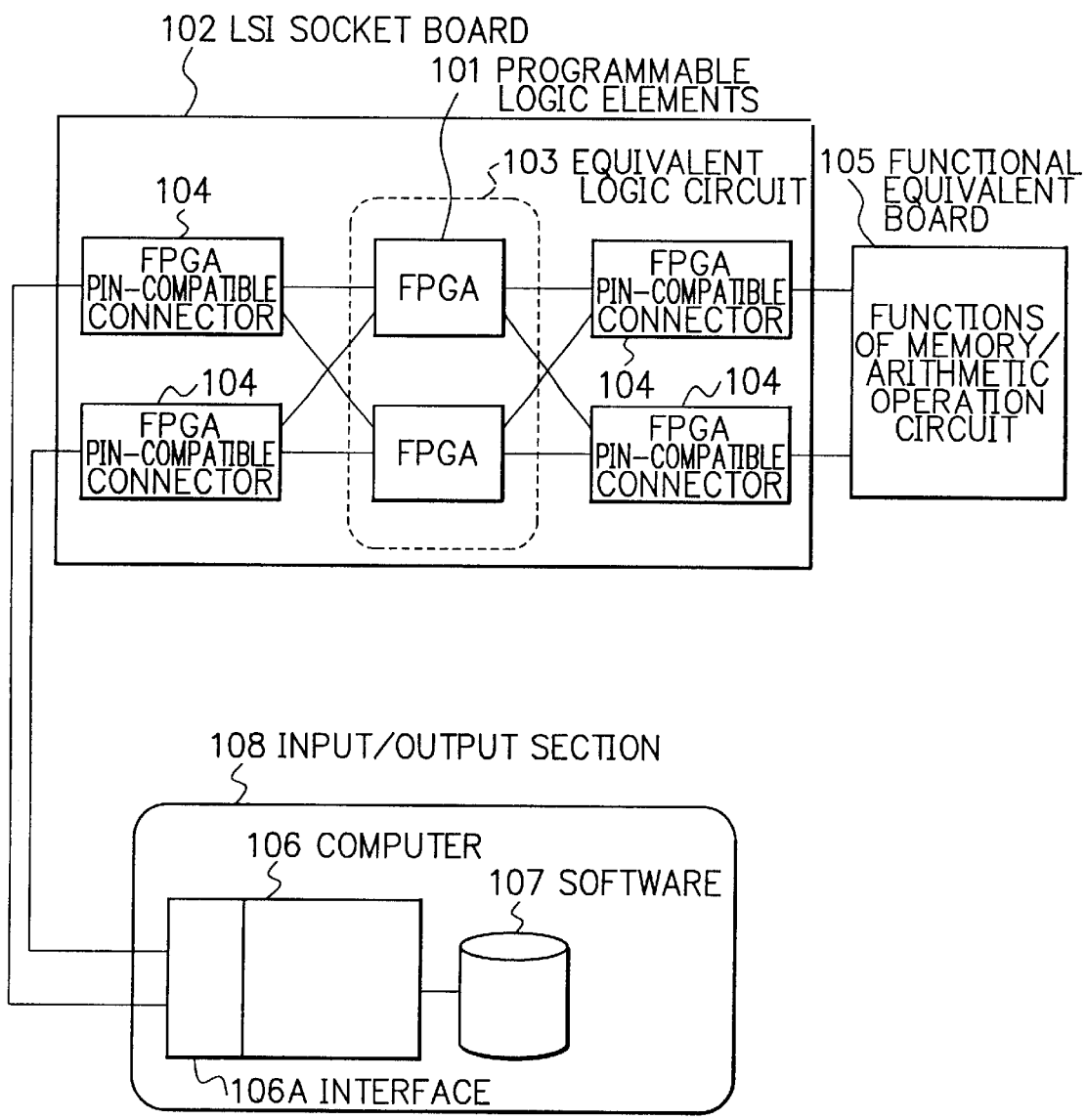
FIG. 1 is a block diagram showing a functional logic circuit verification device according to an embodiment of the present invention.

Referring now to the drawings, a description will be given in detail of preferred embodiments in accordance with the present invention.

FIG. 1 is a block diagram showing a functional logic circuit verification device according to an embodiment of the present invention. Referring to FIG. 1, the functional logic circuit verification device of the embodiment comprises an LSI socket board 102, an equivalent logic circuit 103 which is mounted on the LSI socket board 102, FPGA pin-compatible connectors 104, a functional equivalent board 105 and an input/output section 108.

The equivalent logic circuit 103 on the LSI socket board 102 is composed of programmable logic elements 101 such as FPGAs (Field Programmable Gate Arrays), PLDs (Programmable Logic Devices), etc. The functional equivalent board 105 realizes a circuit that is functionally equivalent to memory, arithmetic operation circuits, etc. in point of input and output. The FPGA pin-compatible connectors 104 are used for connecting the functional equivalent board 105 to the LSI socket board 102, and for connecting the input/output section 108 to the LSI socket board 102. Each of the FPGA pin-compatible connectors 104 has the same pin configuration as the FPGA which is employed as the programmable logic element 101 of the equivalent logic circuit 103. Wiring on the LSI socket board 102 is formed by actually wiring necessary lines, or is implemented by programming programmable devices such as FPGAs (for example, by executing pin-assignment (pin-location) to FPGAs and using them for necessary connection). The input/output section 108 is implemented by a computer 106, software 107 (programs executed by the computer 106) and an interface 106A of the computer 106.

The equivalent logic circuit 103, which is composed of the programmable logic elements 101 (such as FPGAs), realizes logic specifications of a given VLSI etc. (i.e. part of the verified functional logic circuit) to the level of the gate circuit diagram of the VLSI etc. On the other hand, the functional equivalent board 105 does not exactly realize logic specifications of a given VLSI etc. (i.e. the other part of the verified functional logic circuit), however, the functional equivalent board 105 implements a circuit that is totally equivalent to the VLSI etc. in point of input and output.

When the functional equivalent board 105 is used for implementing a memory device, the functional equivalent board 105 is composed of simple memory elements (such as flip-flops), DRAM, and a control logic circuit for controlling them. Therefore, multiple-port memory, high-capacity memory, etc. are implemented by a combination of simple flip-flops, general-purpose memory (DRA) and the control logic circuit.

The functional equivalent board 105 is asynchronously connected to the equivalent logic circuit 103 which is implemented by the programmable logic elements 101 such as FPGAs. The functional equivalent board 105 completes a process and thereby desired data is prepared at the output terminals of the functional equivalent board 105 in one clock cycle of the equivalent logic circuit 103. Therefore, the functional equivalent board 105 is driven by a clock signal whose frequency is higher than the clock frequency of the equivalent logic circuit 103. For example, the clock frequency ratio between the functional equivalent board 105 and the equivalent logic circuit 103 is set to 20:1, 30:1, etc. (5:1 or more).

When the functional equivalent board 105 is used for implementing an arithmetic operation circuit, the functional equivalent board 105 is composed of, for example, general-purpose processors, general-purpose digital signal processors and a control logic circuit for the processors. Instructions for executing a specific arithmetic operation are actually supplied by software to the functional equivalent board 105 including the general-purpose processors etc., and the arithmetic operation is actually executed by the functional equivalent board 105. Thereafter, the control logic circuit of the functional equivalent board 105, which is asynchronously connected to the equivalent logic circuit 103, writes the result of the arithmetic operation to positions (addresses) of the equivalent logic circuit 103 which have been determined according to the specifications of the equivalent logic circuit 103.

The functional equivalent board 105 is connected to the equivalent logic circuit 103 via the FPGA pin-compatible connectors 104. The FPGA pin-compatible connector 104 is provided with pins which are arranged in the same configuration as the pins of the FPGA which is employed as the programmable logic element 101 of the equivalent logic circuit 103. Therefore, the functional equivalent board 105 can be mounted on the LSI socket board 102 in the same way as the FPGAs which are implementing the equivalent logic circuit 103, and thereby the LSI socket board 102 can be designed simply as a board on which only FPGAs are mounted.

The input and output of the functional logic circuit verification device is realized by the input/output section 108 which is implemented by the computer 106, the interface 106A and the software 107, instead of a completed special-purpose input/output device which is specially designed to the particular functional logic circuit verification device. The interface 106A is connected to buses (PCI buses, etc.) of the computer 106 which are connected to an external agent chip (a PCI chip set, etc.) of the CPU of the computer 106. The software 107 and the interface 106A are capable of referring to values of desired registers, flip-flops, etc. of the equivalent logic circuit 103 on the LSI socket board 102, writing data to them, and utilizing the memory space of the functional equivalent board 105. The registers (which can be implemented by programmable logic elements 101 such as FPGAs) are provided to the equivalent logic circuit 103 on the LSI socket board 102 as an "additional circuit" of the equivalent logic circuit 103 for indicating the statuses of the equivalent logic circuit 103 etc. The values of the registers can be read out and rewritten by the interface 106A of the input/output section 108. Due to the functions, the interface 106A can read and write instructions and data from/to the circuits on the LSI socket board 102, and the circuits on the LSI socket board 102 can send signals (such as error signals, operation completion signals, etc.) to the input/output section 108, and thereby the input and output of the functional logic circuit verification device are realized.

The functions of the interface 106A and the software 107 of the functional logic circuit verification device according to the present invention are realized by the reading and writing of values from/to desired registers in the circuits on the LSI socket board 102. Therefore, input and output of a desired functional logic circuit to be verified can be implemented only by changing the composition of the "additional circuit" on the LSI socket board 102, and thus the need for designing and preparing a logically completed special-purpose input/output device is eliminated.

Referring again to FIG. 1, part of the verified functional logic circuit that can easily be implemented by programmable logic elements such as FPGAs is implemented by the equivalent logic circuit 103 which is composed of the programmable logic elements 101, and the equivalent logic circuit 103 is mounted on the LSI socket board 102.

On the other hand, the other part of the verified functional logic circuit (memory, arithmetic operation circuits, etc.) that is difficult to be implemented by programmable logic elements such as FPGAs is implemented by the functional equivalent board 105. The functional equivalent board 105 realizes a circuit that is functionally equivalent to the memory, arithmetic operation circuits, etc. in point of input and output. Incidentally, the number of the functional equivalent boards 105 is not limited to one, and two or more functional equivalent boards 105 can be provided to the functional logic circuit verification device if necessary.

Programs and data for the verification of the functional logic circuit are actually supplied by the input/output section 108 to the equivalent circuit which is implemented by the equivalent logic circuit 103 and the functional equivalent board 105, and whether or not the verified functional logic circuit has specifications capable of operating correctly is judged by inspecting the output of the equivalent circuit.

Figure 2:
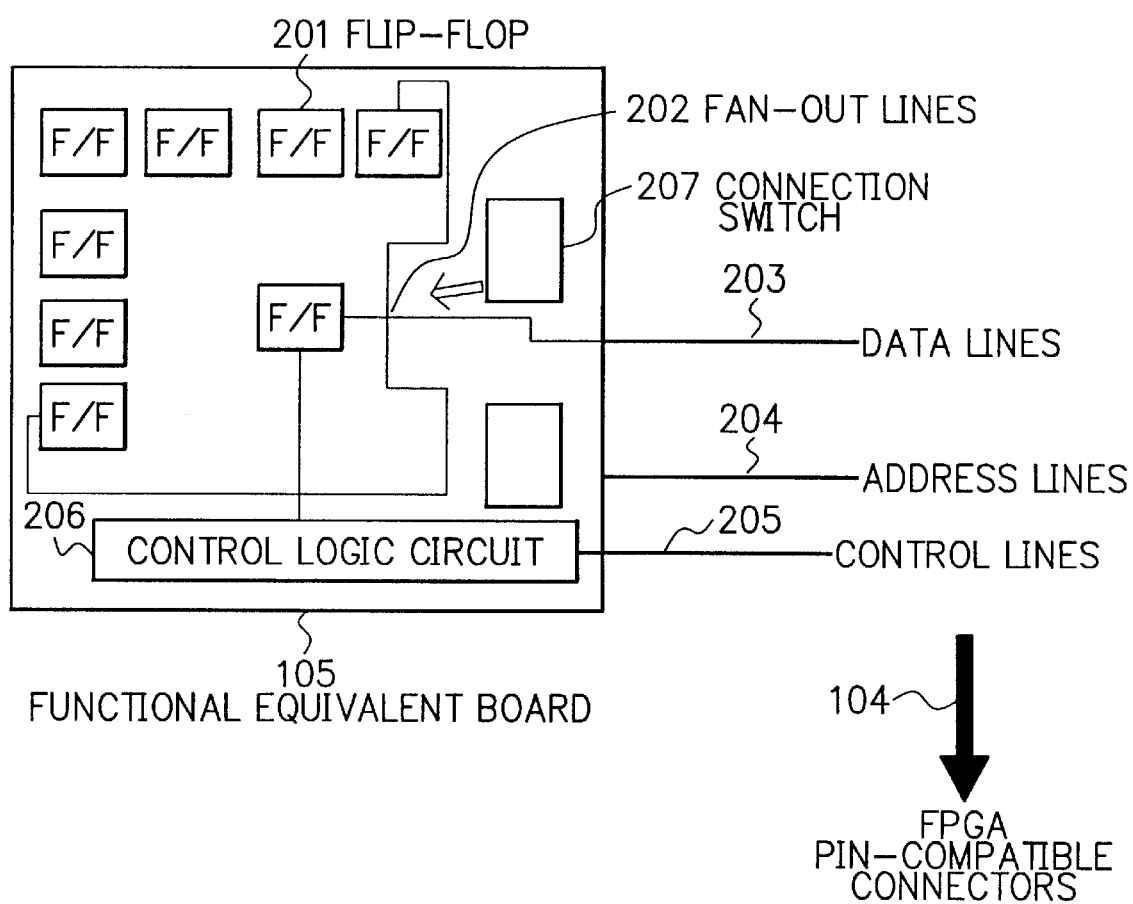
FIG. 2 is a block diagram showing an example of a functional equivalent board of the functional logic circuit verification device of FIG. 1, which is employed for emulating a multiple-port memory.

FIG. 2 is a block diagram showing an example of the functional equivalent board 105 that is employed for emulating a multiple-port memory. The functional equivalent board 105 shown in FIG. 2 implements a circuit that is functionally equivalent to the multiple-port memory in point of input and output. The functional equivalent board 105 of FIG. 2 includes flip-flops 201, fan-out lines 202, data lines 203, address lines 204, control lines 205, a control logic circuit 206 and connection switches 207. The input/output interface of the functional equivalent board 105 of FIG. 2 can be designed so as to be equivalent to the input/output interface of the multiple-port memory which is emulated by the functional equivalent board 105, and thus the functional equivalent board 105 of FIG. 2 can be designed to have the same numbers of data lines 203 and address lines 204 as the emulated multiple-port memory, for example. The functional equivalent board 105 (the data lines 203, the address lines 204 and the control lines 205) is connected to the LSI socket board 102 via the FPGA pin-compatible connectors 104.

The connection switches 207 can be implemented by programmable logic elements such as FPGAs. The contents of the connection switches 207 are rewritten based on the specifications (the number of ports, the bit width (the number of bit lines), etc.) of the multiple-port memory which is emulated by the functional equivalent board 105.

The flip-flops 201 are also implemented by programmable logic elements such as FPGAs, general-purpose SRAMs, DRAMs, etc. Data are actually written in the flip-flops 201 in order to emulate data writing to the multiple-port memory, and are read out from the flip-flops 201 for emulating data reading from the multiple-port memory.

Generally, each flip-flop 201 has to be provided with a fan-out line 202 for data readout. However, in this embodiment, in order to realize functions equivalent to the multiple-port memory, each flip-flop 201 is further provided with one or more fan-out lines 202 for sending data to other flip-flops 201. The number and connections of the fan-out lines 202 are preliminarily set by the connection switches 207.

In data writing to an actual N-port memory, N pieces of different data are written into N different addresses of the N-port memory, however, in the data writing emulation of the N-port memory in this embodiment, N times as many flip-flops 201 as are necessary for implementing functions of 1-port memory are prepared and an N times as large memory space (i.e. N memory spaces MS(1), MS(2), . . . MS(N)) is set up. In the data writing emulation, an address and a piece of data are designated with respect to each port of the N-port memory, that is, with respect to each memory space MS(i) (i=1, 2, . . . , N), and each data is written in the designated address (flip-flops 201) of the memory space MS(i). Therefore, N addresses and N pieces of data corresponding to the N ports of the N-port memory are simultaneously designated (that is, simultaneously supplied from the equivalent logic circuit 103 to the functional equivalent board 105), and the N pieces of data are simultaneously written in the N addresses respectively.

In order to ensure data consistency, right after a data writing to a flip-flop 201 in a memory space MS(i), the written data is copied to N−1 address-equivalent flip-flops 201 in the other N−1 memory spaces, via the fan-out lines 202. In the case where the data writing is executed to T addresses (flip-flops 201) of the memory space MS(i), the above copying process is repeated T times.

The control logic circuit 206 controls reading and writing from/to the functional equivalent board 105. The control logic circuit 206 receives instructions (reading instructions, writing instructions, etc.) from the equivalent logic circuit 103 via the control lines 205, interprets the instructions, and executes the instructions. For example, in the case of the data writing emulation, the control logic circuit 206 receives a writing instruction, N addresses, N pieces of data from the equivalent logic circuit 103 via the control lines 205, the address lines 204 and the data lines 203 respectively, and writes the N pieces of data in memory areas of the functional equivalent board 105 corresponding to the N addresses respectively. In the case where the flip-flops 201 are implemented by volatile memory such as DRAMs, the control logic circuit 206 also executes refresh of the flip-flops 201.

In data reading emulation of an M-port memory, M times as many flip-flops 201 as are necessary for implementing functions of 1-port memory are prepared and an M times as large memory space (i.e. M memory spaces MS(1), MS(2), . . . , MS(N)) is set up. The control logic circuit 206 receives a reading instruction and M addresses from the equivalent logic circuit 103 via the control lines 205 and the address lines 204 respectively, and reads out M pieces of data from flip-flops 201 (corresponding to the M addresses) of the M memory spaces MS(1), MS(2), . . . , MS(M respectively, avoiding collision.

The multiple-port reading/writing, the interpretation of instructions, the refresh, etc, are executed by the functional equivalent board 105 in one clock cycle of the equivalent logic circuit 103 (in some to some tens of clock cycles of the functional equivalent board 105).

Figure 3:
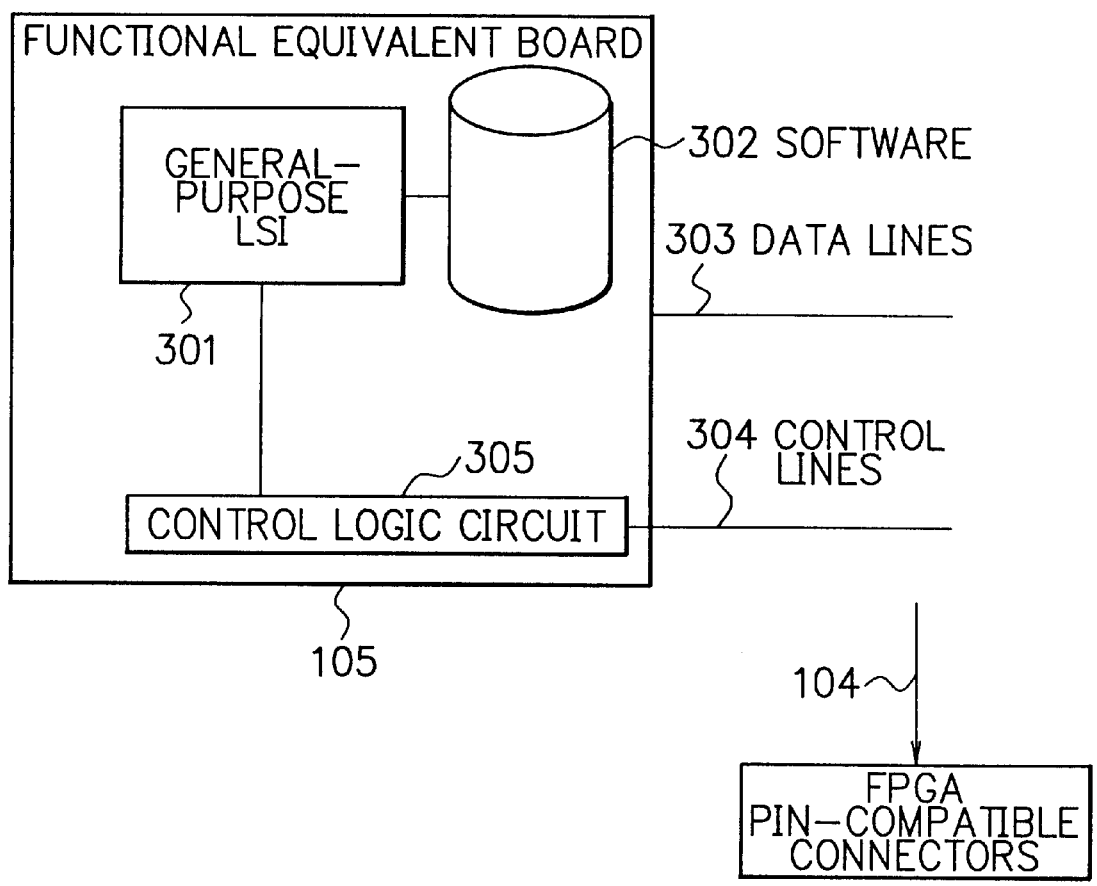
FIG. 3 is a block diagram showing another example of the functional equivalent board that is employed for emulating an arithmetic operation circuit.

FIG. 3 is a block diagram showing another example of the functional equivalent board 105 that is employed for emulating an arithmetic operation circuit. The functional equivalent board 105 shown in FIG. 3 implements a circuit that is functionally equivalent to the arithmetic operation circuit in point of input and output. The functional equivalent board 105 of FIG. 3 includes a general-purpose LSI 301, software 302, data lines 303, control lines 304 and a control logic circuit 305. The input/output interface of the functional equivalent board 105 of FIG. 3 can be designed so as to be equivalent to the input/output interface of the arithmetic operation circuit which is emulated by the functional equivalent board 105, and thus the functional equivalent board 105 of FIG. 3 can be designed to have the same number of data lines 303 as the emulated arithmetic operation circuit, for example. The functional equivalent board 105 (the data lines 303 and the control lines 304) is connected to the LSI socket board 102 via the FPGA pin-compatible connectors 104.

Information and data concerning a particular arithmetic operation are supplied from the equivalent logic circuit 103 via the control lines 304 and the data lines 303 respectively. The general-purpose LSI 301 (a CPU, a DSP, etc.) executes the arithmetic operation according to a sequence which is designated by the software 302, and outputs the result of the arithmetic operation to the equivalent logic circuit 103 via the data lines 303. The control lines 304 and the data lines 303 are connected to the LSI socket board 102 (on which the equivalent logic circuit 103 is mounted) via the FPGA pin-compatible connectors 104.

The control logic circuit 305 controls the general-purpose LSI 301 so as to complete the arithmetic operation and output the result of the arithmetic operation to appropriate part of the equivalent logic circuit 103 in one clock cycle of the equivalent logic circuit 103 (in some to some tens of clock cycles of the functional equivalent board 105).

Figure 4:
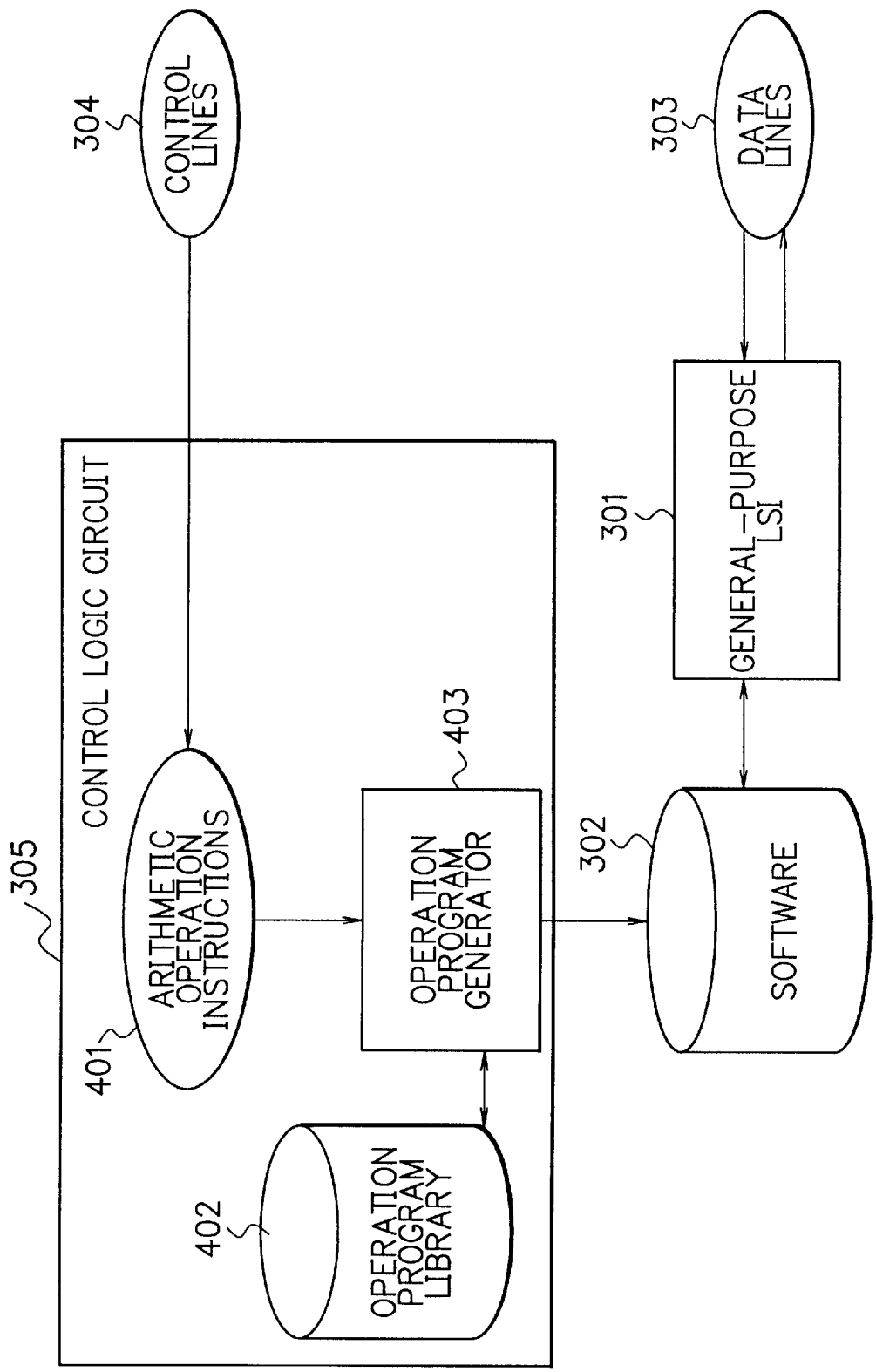
FIG. 4 is a block diagram for explaining the operation of the functional equivalent board of FIG. 3 which emulates the arithmetic operation circuit.

FIG. 4 is a block diagram for explaining the operation of the above functional equivalent board 105 which emulates the arithmetic operation circuit. The control logic circuit 305 of the functional equivalent board 105 generates an operation program as follows based on information that is supplied from the equivalent logic circuit 103 via the control lines 304, and gives the operation program to the software 302. First, the control logic circuit 305 extracts arithmetic operation instructions 401 from the information which is supplied from the equivalent logic circuit 103 via the control lines 304. In the control logic circuit 305, programs for predetermined operations (addition, multiplication, division, etc.) are preliminarily stored in an operation program library 402. An operation program generator 403 of the control logic circuit 305 generates a sequence of an operation program based on the arithmetic operation instructions 401 and using the programs extracted from the operation program library 402, and gives the generated operation program to the software 302. The general-purpose LSI 301 executes arithmetic operations to data which is supplied from the data lines 303 according to the software 302 (according to the operation program), and outputs the result of the arithmetic operations to the data lines 303. The above process is executed by the functional equivalent board 105 in one clock cycle of the equivalent logic circuit 103 (in some to some tens of clock cycles of the functional equivalent board 105).

Figure 5:
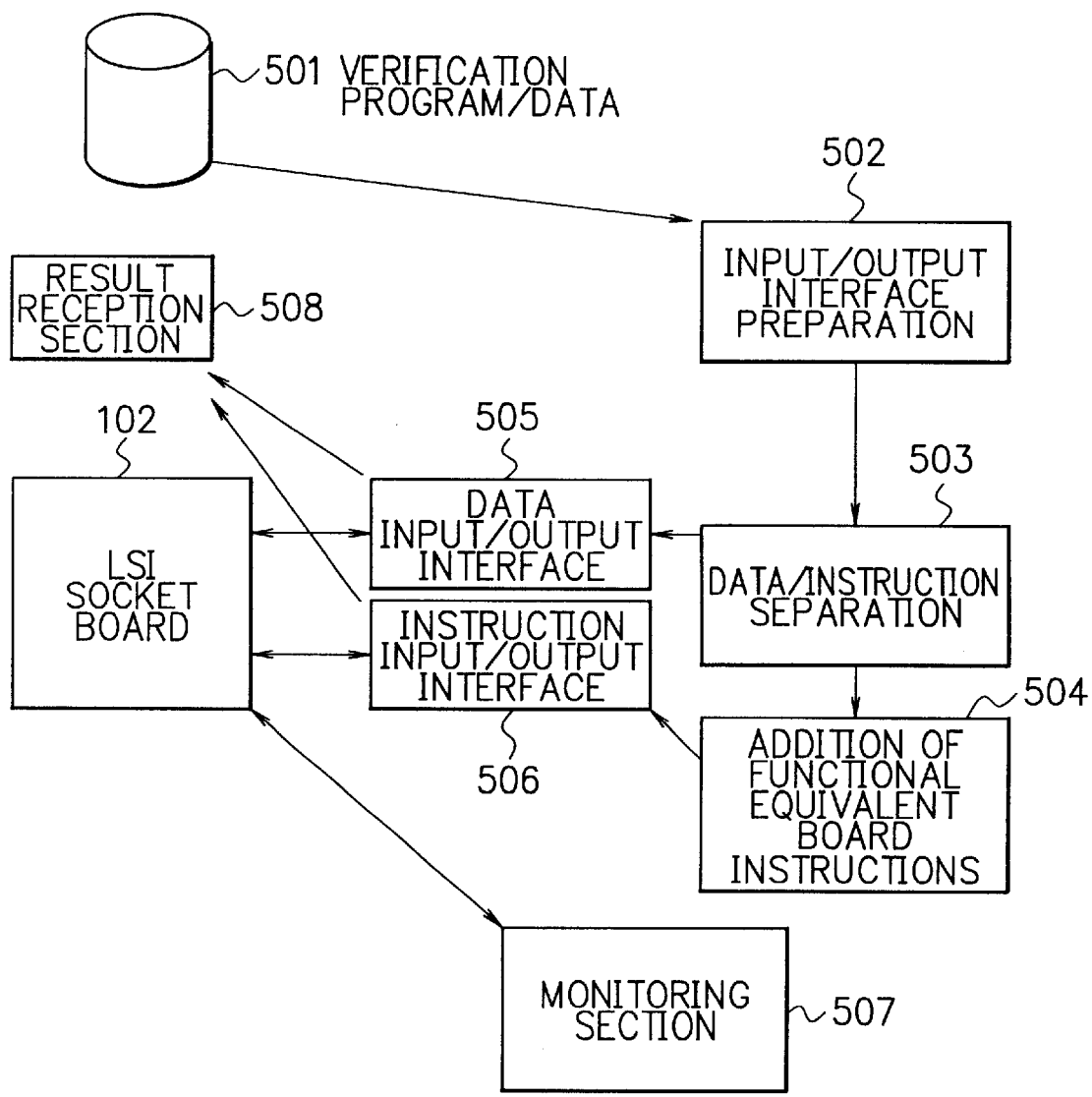
FIG. 5 is a block diagram for explaining the operation of the functional logic circuit verification device according to the embodiment of the present invention.

FIG. 5 is a block diagram for explaining the operation of the functional logic circuit verification device according to the embodiment of the present invention. A functional logic circuit such as a VLSI to be verified is emulated by the equivalent logic circuit 103 on the LSI socket board 102 and the functional equivalent board 105. In order to verify the functional logic circuit (a VLSI etc.), a verification program/ data 501 (i.e. a program and data for verification) has to be actually inputted to the functional logic circuit verification device and the result of the operation of the functional logic circuit verification device has to be obtained.

Referring to FIG. 5, the "INPUT/OUTPUT INTERFACE PREPARATION 502", the "DATA/INSTRUCTION SEPARATION 503" and the "ADDITION OF FUNCTIONAL EQUIVALENT BOARD INSTRUCTIONS 504" represent processes which are executed by the software 107 of the input/output section 108. First, a data input/output interface 505 and an instruction input/output interface 506 are prepared in the interface 106A of the computer 106 of the input/output section 108 in the "INPUT/OUTPUT INTERFACE PREPARATION 502", according to the verification program/data 501. In the "DATA/INSTRUCTION SEPARATION 503", the verification program/data 501 is separated into data and instructions. There are cases where special instructions for the functional equivalent board 105 have to be added to the instructions which have been separated in the "DATA/INSTRUCTION SEPARATION 503". In such cases, the special instructions for the functional equivalent board 105 are added to the instructions in the "ADDITION OF FUNCTIONAL EQUIVALENT BOARD INSTRUCTIONS 504".

The data is supplied to the LSI socket board 102 (on which the equivalent logic circuit 103 is implemented) via the data input/output interface 505, and the instructions are supplied to the LSI socket board 102 via the instruction input/output interface 506.

The LSI socket board 102, which received the instructions and the data, actually executes the instructions using the data (that is, electric signals are actually passed in the LSI socket board 102), and outputs data and instructions (error signals, operation completion signals, etc.) to a result reception section 508 (a logic analyzer, memory, etc.) via the data input/output interface 505 and the instruction input/output interface 506 respectively.

The input and output of the data and the instructions to/from the LSI socket board 102 are monitored by a monitoring section 507 of the interface 106A of the input/ output section 108 so that congestion will not occur in the input/output to/from the LSI socket board 102. In cases where the congestion occurred, the monitoring section 507 outputs an instruction for keeping the current status until data input/output becomes possible (an NOP (no operation) instruction etc.) to the instruction input/output interface 506.

Figure 6:
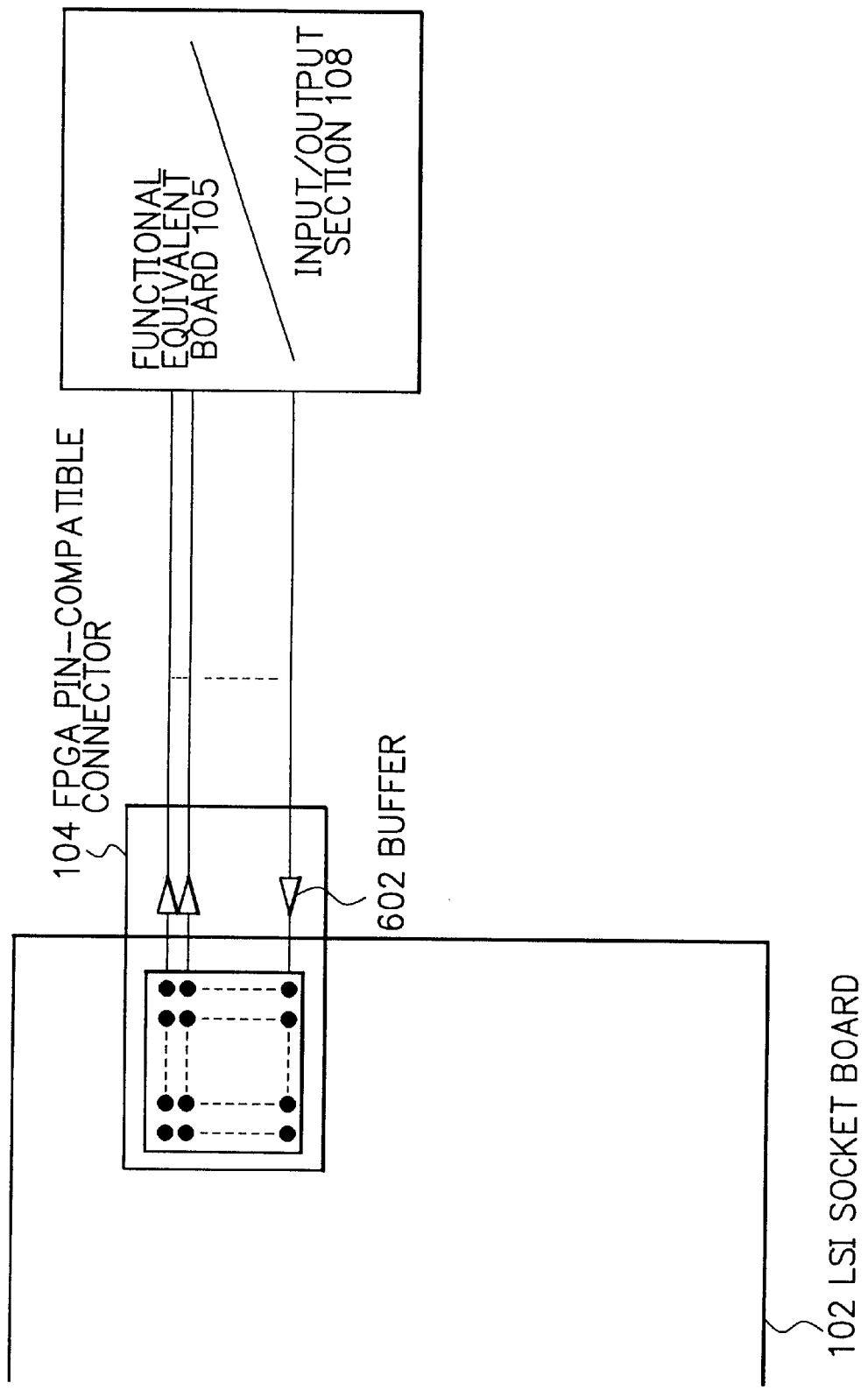
FIG. 6 is a block diagram showing the details of an FPGA pincompatible connector which is employed in the functional logic circuit verification device of FIG. 1.

FIG. 6 is a block diagram showing the details of the FPGA pin-compatible connector 104 which is used for connecting the functional equivalent board 105 to the LSI socket board 102 and for connecting the input/output section 108 to the LSI socket board 102. Referring to FIG. 6, the FPGA pin-compatible connector 104 has the same pin configuration as the pin configuration (according to DIP (dual in-line package), PGA (pin grid array), BGA (ball grid array), etc.) of the FPGA which is employed as the programmable logic element 101 of the equivalent logic circuit 103 on the LSI socket board 102. The FPGA pin-compatible connector 104 is provided with buffers 602 in order to ensure driving abilities in the connections.

By the pin configuration of the FPGA pin-compatible connector 104 which is equivalent to the pin configuration of the programmable logic element 101 (such as the FPGA) employed for implementing the equivalent logic circuit 103 on the LSI socket board 102, the functional equivalent board 105 and the input/output section 108 can be connected to the LSI socket board 102 in the same way as the programmable logic elements 101 of the equivalent logic circuit 103 needing no special interface. Therefore, the LSI socket board 102 can be designed simply using pin configuration information of the programmable logic element 101 (such as the FPGA) only.

Incidentally, when other type of LSIs than FPGAs are employed as the programmable logic elements 101 of the equivalent logic circuit 103, LSI pin-compatible connectors (each of which having the same pin configuration as that of the LSI) instead of the FPGA pin-compatible connectors 104 can be used for the connection to the LSI socket board 102.

As set forth hereinabove, in the functional logic circuit verification device according to the present invention, part of the verified functional logic circuit (memory, arithmetic operation circuits, etc.) that is difficult to be implemented by general programmable logic elements such as FPGAs is implemented and emulated by the functional equivalent board 105 including other components than FPGAs. Therefore, an equivalent circuit for the verified functional logic circuit such as a VLSI can be implemented and prepared more easily in comparison with conventional verification techniques, and thereby the efficiency of the verification can be improved.

Further, the input and output of the program and data to/from the equivalent circuit are realized by the input/ output section 108 which is composed of the computer 106, the software 107 and the interface 106A of the computer 106. Therefore, the need for specially manufacturing the logically completed special-purpose input/output hardware can be eliminated, and the implementation of the input/ output of the equivalent circuit can be executed in software-like manners.

Furthermore, the FPGA pin-compatible connectors 104 (each of which having the same pin configuration as the FPGA which is employed as the programmable logic element 101 of the equivalent logic circuit 103) are employed for the connection of the functional equivalent board 105 to the LSI socket board 102 and the connection of the input/ output section 108 to the LSI socket board 102. Therefore, the LSI socket board 102 can be regarded as a circuit board on which only FPGAs are mounted, and thus the LSI socket board 102 can be designed easily and efficiently using the pin configuration information of the FPGAs (programmable logic elements 101) only.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A functional logic circuit verification device for verifying the operation of a functional logic circuit, by implementing a circuit that is functionally equivalent to the functional logic circuit and by supplying electric signals thereto, the device comprising:

an equivalent logic circuit mounted on a circuit board and composed of programmable logic elements, the equivalent logic circuit implementing logic specifications, of only a part of the functional logic circuit, to a gate circuit diagram level of the part of the verified functional logic circuit;

a functional equivalent board which implements a circuit that is functionally equivalent, for input and output, to an other part of the verified functional logic circuit;

one or more functional equivalent board connectors for connecting the functional equivalent board to the circuit board on which the equivalent logic circuit is mounted;

an input/output section for implementing input and output of the functional logic circuit verification device; and one or more input/output section connectors for connecting the input/output section to the circuit board on which the equivalent logic circuit is mounted.

2. A functional logic circuit verification device as claimed in claim 1, wherein the circuit board on which the equivalent logic circuit is mounted is an LSI socket board having a plurality of sockets for LSIs.

3. A functional logic circuit verification device as claimed in claim 2, wherein the functional equivalent board connectors and/or and the input/output section connectors are LSI pin-compatible connectors each of which has a same pin configuration as LSIs employed as the programmable logic elements of the equivalent logic circuit.

4. A functional logic circuit verification device as claimed in claim 3, wherein the at least one LSI pin-compatible connector comprises buffers for ensuring driving abilities in connections.

5. A functional logic circuit verification device as claimed in claim 1, wherein the programmable logic elements of which the equivalent logic circuit is composed are FPGAs (Field Programmable Gate Arrays).

6. A functional logic circuit verification device as claimed in claim 5, wherein the functional equivalent board connectors and/or the input/output section connectors are FPGA pin-compatible connectors each of which has the same pin configuration as the FPGAs which are employed as the programmable logic elements of the equivalent logic circuit.

7. A functional logic circuit verification device as claimed in claim 1, wherein the functional equivalent board comprises data lines, address lines, control lines, a control logic circuit, connection switches, and flip-flops each of which having fan-out lines, and wherein the functional equivalent board implements a circuit that is functionally equivalent, for input and output, to a multiple-port memory.

8. A functional logic circuit verification device as claimed in claim 7, wherein the functional equivalent board has an input/output interface that is equivalent, pin-for-pin, to an input/output interface of the multiple-port memory.

9. A functional logic circuit verification device as claimed in claim 1, wherein the functional equivalent board includes data lines, control lines, a general-purpose LSI, software for letting the general-purpose LSI execute a desired process, and a control logic circuit, and thereby implements a circuit that is functionally equivalent, for input and output, to an arithmetic operation circuit.

10. A functional logic circuit verification device as claimed in claim 9, wherein the functional equivalent board has an input/output interface that is functionally equivalent to the input/output interface of the arithmetic operation circuit.

11. A functional logic circuit verification device as claimed in claim 9, wherein the functional equivalent board further comprises:

an operation program library in which programs for predetermined operations are preliminarily stored, the predetermined operations including at least one of addition, multiplication, division, and subtraction; and an operation program generator operative to generate a sequence of an operation program to be executed by the general-purpose LSI, based on arithmetic operation instructions which are supplied from the equivalent logic circuit via the control lines, using the programs extracted from the operation program library.

12. A functional logic circuit verification device as claimed in claim 1, wherein the input/output section includes:

a computer;

an interface of the computer to the circuit board on which the equivalent logic circuit is mounted; and control software which is executed by the computer for controlling the interface.

13. A functional logic circuit verification device for verifying the operation of a functional logic circuit such as a VLSI, by implementing a circuit that is functionally equivalent to the functional logic circuit and by supplying electric signals thereto, the device comprising:

an equivalent logic circuit mounted on a circuit board and composed of programmable logic elements, the equivalent logic circuit implementing logic specifications, of only a part of the functional logic circuit, to a gate circuit diagram level of the part of the verified functional logic circuit;

a functional equivalent board which implements a circuit that is functionally equivalent, for input and output, to an other part of the verified functional logic circuit;

one or more functional equivalent board connectors for connecting the functional equivalent board to the circuit board on which the equivalent logic circuit is mounted;

an input/output section for implementing input and output of the functional logic circuit verification device, the input/output section including a computer, an interface of the computer to the circuit board on which the equivalent logic circuit is mounted, and control software which is executed by the computer for controlling the interface; and one or more input/output section connectors for connecting the input/output section to the circuit board on which the equivalent logic circuit is mounted;

wherein, based on the control software, the input/output section prepares an instruction input/output interface and a data input/output interface in the interface of the computer according to a verification program/data, separates the verification program/data into instructions and data, sends the separated instructions to the instruction input/output interface so as to be inputted to the circuit board on which the equivalent logic circuit is mounted, and sends the separated data to the data input/output interface so as to be inputted to the circuit board.

14. A functional logic circuit verification device as claimed in claim 13, wherein the control software of the input/output section adds special instructions for the functional equivalent board to the separated instructions, and sends the separated instructions including the special instructions to the instruction input/output interface for inputting the separated instructions including the special instructions to the circuit board.

15. A functional logic circuit verification device as claimed in claim 12, wherein the interface of the input/output section includes a monitor for monitoring the input/output of data and instructions to/from the circuit board.

16. A functional logic circuit verification device as claimed in claim 1, wherein the functional equivalent board comprises data lines, address lines, control lines, a control logic circuit, connection switches, and dynamic random access memories (DRAMs) each of which having fan-out lines, and wherein the functional equivalent board implements a circuit that is functionally equivalent, for input and output, to a multiple-port memory.

17. A functional logic circuit verification device as claimed in claim 7, wherein the control logic circuit is operative both to control DRAM to perform as static random access memory (SRAM) in realizing memory for the verifying, and to arrange the SRAM-performance-DRAM and the flip-flops to be used as multi-port memory.

18. A functional logic circuit verification device as claimed in claim 1, wherein the input/output section is operative to individually determine data of the functional logic circuit verification device without a structural change of the input/output section.

* * * * *

UNITED STATES PATENT AND TRADEMARK OFFICE
CERTIFICATE OF CORRECTION

PATENT NO.    : 6,381,565 B1
DATED         : April 30, 2002
INVENTOR(S)   : Yuichi Nakamura It is certified that error appears in the above-identified patent and that said Letters Patent is hereby corrected as shown below:

<u>Title page,</u>
Item [57], ABSTRACT,
Line 2, delete "fictionally" insert -- functionally --

<u>Column 5,</u>
Line 4, delete "(DRA" insert -- (DRAM) --

<u>Column 7,</u>
Line 59, delete "MS (N)" insert -- MS (M) --;
Line 64, delete "MS (M" insert -- MS (M) --

Signed and Sealed this

Twenty-ninth Day of October, 2002

Attest:

Attesting Officer

JAMES E. ROGAN
*Director of the United States Patent and Trademark Office*